United States Patent
Brusberg et al.

(10) Patent No.: US 11,656,407 B2
(45) Date of Patent: *May 23, 2023

(54) FLEXIBLE CERAMIC WAVEGUIDES FOR TERAHERTZ APPLICATIONS AND USE AS ON-BOARD INTERCONNECTS

(71) Applicant: CORNING INCORPORATED, Corning, NY (US)

(72) Inventors: Lars Martin Otfried Brusberg, Corning, NY (US); Alan Frank Evans, Beaver Dams, NY (US); Michael John Yadlowsky, Sunnyvale, CA (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/391,379

(22) Filed: Aug. 2, 2021

(65) Prior Publication Data
US 2021/0356666 A1    Nov. 18, 2021

Related U.S. Application Data

(63) Continuation of application No. 16/842,871, filed on Apr. 8, 2020, now Pat. No. 11,105,976.
(Continued)

(51) Int. Cl.
*G02B 6/125*     (2006.01)
*G02B 6/122*     (2006.01)
(Continued)

(52) U.S. Cl.
CPC ........... *G02B 6/1228* (2013.01); *G02B 6/125* (2013.01); *H01P 3/16* (2013.01); *H05K 1/0274* (2013.01);
(Continued)

(58) Field of Classification Search
CPC ........ G02B 6/1228; G02B 6/125; G02B 6/12; G02B 6/12004; G02B 6/122; G02B 6/42;
(Continued)

(56) References Cited

U.S. PATENT DOCUMENTS 9,705,174 B2 *  7/2017  Payne ................. H01P 3/16
10,459,160 B2   10/2019 Brusberg
(Continued)

OTHER PUBLICATIONS

Hou et al; "Microstrip-Fed Surface-Wave Antenna for Endfire Radiation"; IEEE Transactions on Antennas and Propagation, vol. 67, No. 1, Jan. 2019 p. 580.
(Continued)

*Primary Examiner* — Stephen E. Jones
(74) *Attorney, Agent, or Firm* — Russell S. Magaziner

(57) ABSTRACT

A terahertz (THz) waveguide and method for production allows for THz waveguides to be used in or on a printed circuit board (PCB) such that the propagation of THz waves require less power, result in less signal loss due to radiation or dispersion, and propagate more efficiently. Additionally, the position and/or geometry of a waveguide, as well as any additional antenna or coupling element, may be adjusted on or in the PCB such that the electromagnetic field of the waveguide may more efficiently couple with the electromagnetic field of the PCB.

15 Claims, 13 Drawing Sheets

Related U.S. Application Data

(60) Provisional application No. 62/895,200, filed on Sep. 3, 2019.

(51) Int. Cl.
*H05K 1/02* (2006.01)
*H01P 3/16* (2006.01)
*H04B 3/52* (2006.01)
*G02B 6/12* (2006.01)
*H01P 5/08* (2006.01)

(52) U.S. Cl.
CPC ...... *G02B 2006/12038* (2013.01); *H01P 5/08* (2013.01); *H04B 3/52* (2013.01)

(58) Field of Classification Search
CPC ................. G02B 6/428; G02B 6/4281; G02B 2006/12038; H05K 1/0274; H01P 3/16; H01P 5/08
See application file for complete search history.

(56) References Cited

U.S. PATENT DOCUMENTS

| | | | |
|---|---|---|---|
| 11,105,976 B2* | 8/2021 | Brusberg | H05K 1/0274 |
| 2011/0013269 A1 | 1/2011 | Ogawa et al. | |
| 2016/0375607 A1* | 12/2016 | Badding | C04B 35/64 |
| | | | 428/220 |
| 2019/0287908 A1 | 9/2019 | Dogiamis et al. | |

OTHER PUBLICATIONS

Richter et al; "A Broadband Transistion Between Dielectric and Planar Waveguides at Millimeterwave Frequencies"; 33rd European Microwave Conference—Munich 2003, p. 947.
Yeh et al; "Communication at Millimetre-Submillimetre Wavelengths Using a Ceramic Ribbon"; 404 Nature 584 (2000).
Yeh et al; "Low-Loss Terahertz Ribbon Waveguides"; 44 Applied Optics 28, 5937 (2005).

* cited by examiner

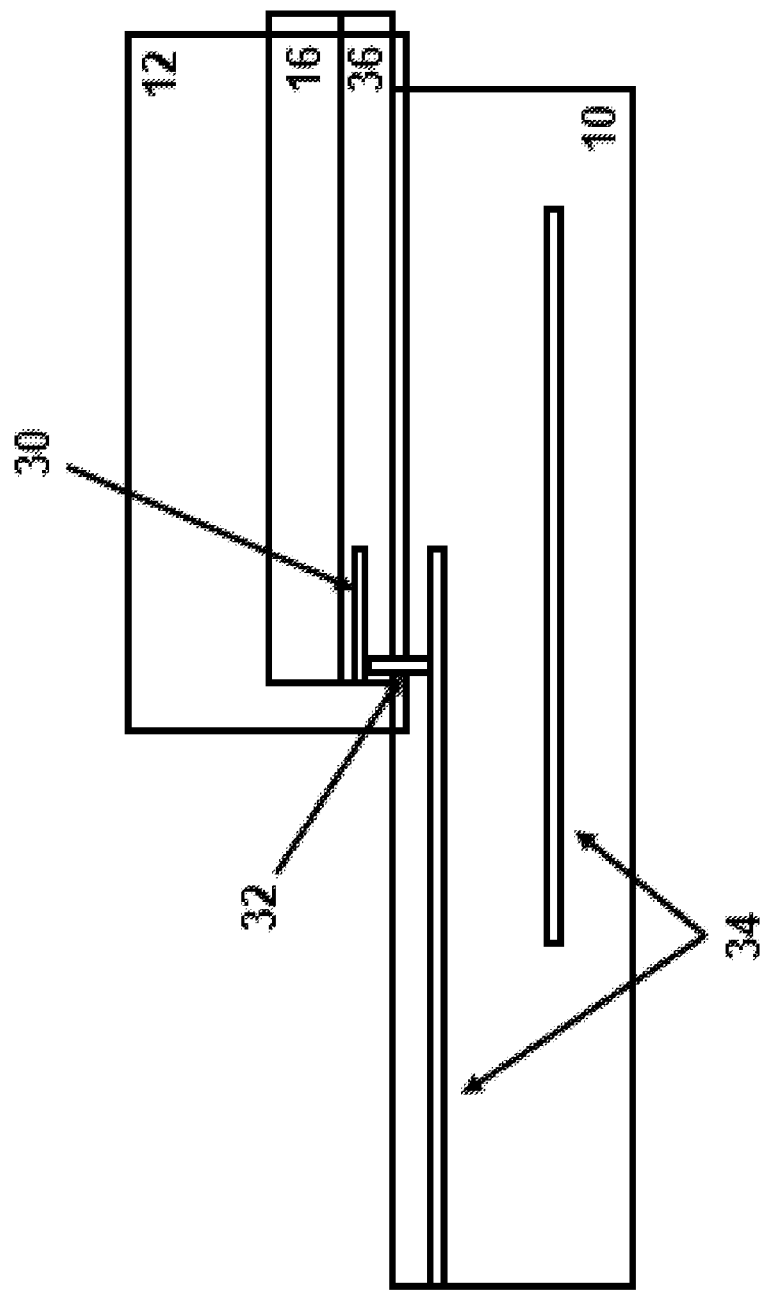

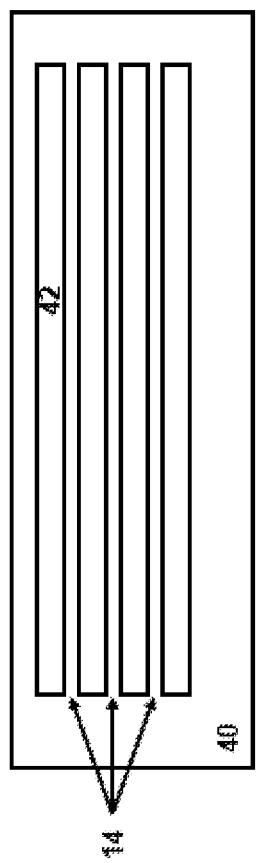
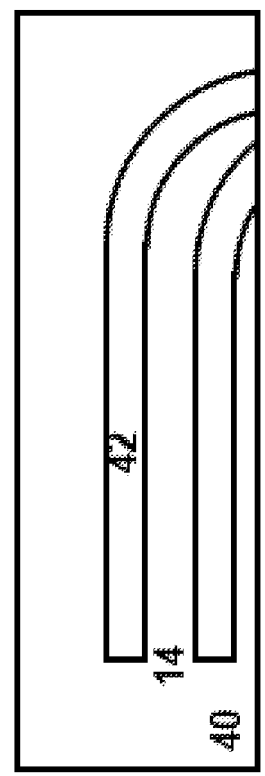

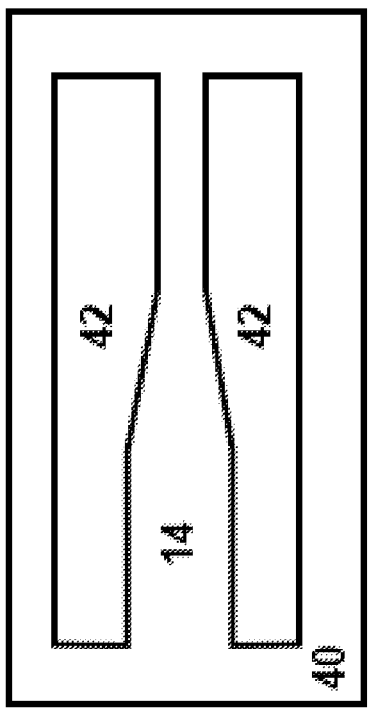
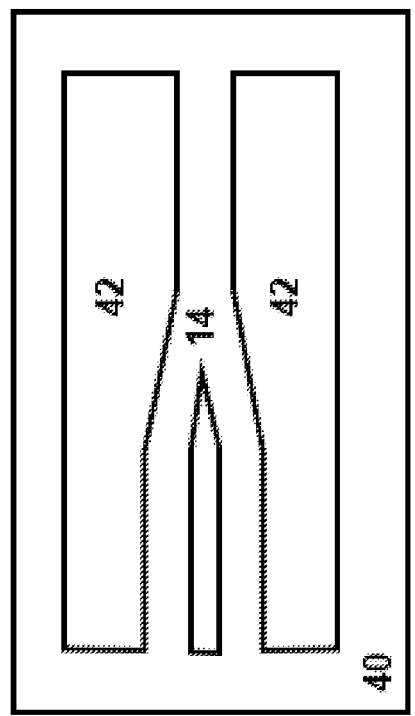

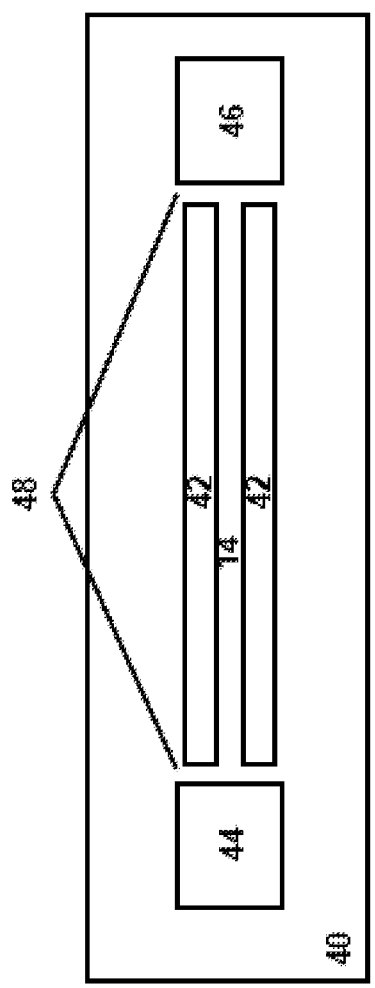
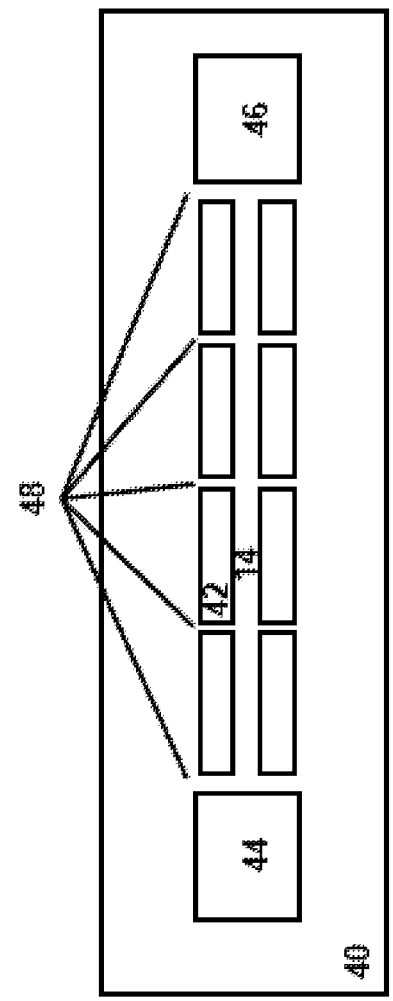

FLEXIBLE CERAMIC WAVEGUIDES FOR TERAHERTZ APPLICATIONS AND USE AS ON-BOARD INTERCONNECTS

CROSS-REFERENCE TO RELATED APPLICATIONS

This application is a continuation of U.S. application Ser. No. 16/842,871 filed Apr. 8, 2020, which claims the priority benefit of U.S. Application No. 62/895,200 filed Sep. 3, 2019, both of which are incorporated by reference herein in their entireties.

BACKGROUND

Optical communication systems typically operate at the near-infrared bands of the electromagnetic spectrum having wavelengths on the order of 800 nm to 2000 nm. Other types of communication systems such as cell phone systems operate at radio-wave band of the electromagnetic (EM) spectrum from about 3 KHz to 60 GHz, with plans to extend this range into the microwave and millimeter bands, which extend up to about 300 GHz. The move to higher and higher RF and microwave frequencies has been enabled in part by developments in state of the art complementary metal-oxide-semiconductor ("CMOS")-based EM radiation sources and receivers that can operate at frequencies greater than 100 GHz.

The terahertz wavelength range of the EM spectrum is generally considered to range from 0.1 THz (=100 GHz) to 10 THz (10,000 GHz), where the corresponding free-space wavelength is denoted $\lambda_0$ and is in the range from 3 mm to 0.03 mm. In a dielectric material with the real part of the dielectric constant c', the wavelength $\lambda$, is given by $\lambda=\lambda_0/(\varepsilon')^{1/2}$. More generally, the dielectric constant is expressed as $\varepsilon=\varepsilon'+i\varepsilon''$ where $\varepsilon''$ is the imaginary or lossy part of the dielectric constant. Terahertz ("THz") waveguides can be formed from a guiding structure in which the real part of the dielectric constant is higher than that of the surrounding material or space. Such waveguides can be used to confine and transport a THz optical signal from a source location to a receiver location.

The sub-mm wave or THz band (i.e., having a wavelength between 0.1 mm-1 mm) is one of the least explored sections of the electromagnetic spectrum. This is due to the historical cost of sources and detectors and a lack of a low-loss guiding structures, equivalent to an optical fiber that may be used with visible and infrared wavelengths. Traditional microstrip line circuits, or metallic waveguides at microwave frequencies are generally insufficient to support low loss THz band propagation because high-frequency signals may be absorbed by the materials. Similarly dielectric waveguide for millimeter waves have generally been lossy due to radiation and/or subject to dispersion and have been difficult to costly to use. Even the modern surface plasmon polariton waveguides are too lossy for long-distance transmission in THz bands. Lossy means having or involving the dissipation of electrical or electromagnetic energy.

Most THz waveguides are made of a metal or a plastic and are not made of ceramic materials. While fused silica glass has relatively good transmission at THz frequencies, it is relatively fragile as compared to metal and plastic and therefore makes it difficult to form a commercially viable THz waveguide product. Said differently, a commercially viable THz waveguide product needs to have both sufficiently low loss in the THz frequency range and be mechanically robust so that it can be handled for manufacturing and operate for extended periods of time in a wide range of environments.

Yeh et al. has proposed a concept for overcoming this drawback and describes a new family of an ultra-low-loss rectangular single-mode waveguide structure for propagating THz signals, which has an attenuation constant more than 100× less than that of a conventional dielectric or metallic waveguide. Cavour Yeh et al., *Low-Loss Terahertz Ribbon Waveguides,* 44 APPLIED OPTICS 28, 5937 (2005); Cavour Yeh et al., *Communication at Millimetre-Submillimetre Wavelengths Using a Ceramic Ribbon,* 404 NATURE 584 (2000). The material Yeh et al. uses is a high purity alumina "rectangular rod" (99.8% purity, 10:1 aspect ratio with 0.635 mm in thickness, 6.35 mm in width and 910 mm in length), operated in 30-40 GHz. However, the thickness of the rectangular rod limits its application in higher frequency signals and its flexibility.

For high speed interconnects, optical transceivers can be co-packaged with an integrated package carrying basic components and common functionalities for a programmable logic circuit ("PL IC") or an application-specific integrated circuit customized for a particular use ("ASIC") on the same substrate to reduce the length of electrical interconnects to a few millimeters for 112 GB/s and above electrical signal links. The reduced length between electrical interconnects is required because of high loss of electrical signals at higher frequencies and an increase in power consumption. Power and costs can be saved when transceivers are close to the integrated circuit ("IC") and optically interconnected with the fiber network of the building (e.g. datacenter) or between buildings. Today, fiber array units (FAU) are a fiber assembly with an array of fibers aligned in a V-groove and end-face polished. The FAU is actively aligned to electronic integrated circuits (PIC) and permanently attached to provide a connector interface to the transceiver. The fiber length can be short for pluggable transceivers or customized in length for other applications.

In some aspects, waveguides may be used as a transmission line to guide electromagnetic waves. For example, waveguides may confine electromagnetic waves to propagate in one dimension such that the waves lose a reduced amount of power as it propagates during transmission. Waveguides may be configured for the transmission of electromagnetic waves at different wavelengths. For example, waveguides may be configured to transmit electromagnetic wavelengths within the visible, infrared, radio, microwave, or terahertz bands of the electromagnetic spectrum though the useful range of operation of a particular waveguide technology is typically limited. Waveguides may be designed to minimize loss (e.g., dissipation of energy) while maintaining flexibility, specific dimensions, shape, or the other properties for the desired end use. In some examples, waveguides configured to guide electromagnetic waves within a certain band of the electromagnetic spectrum may be different than waveguides configured to guide electromagnetic waves within a different band of the electromagnetic spectrum. In this way, waveguides may be designed (e.g., shape, dimensions, material, or the like) to optimize performance based on the wavelengths of the electromagnetic spectrum the waveguide is intended to transmit.

Applicant's cutting-edge technology, continuous firing process, and ribbon ceramics products offers the manufacturing of an ultra-high purity alumina ribbon waveguide with an extremely thin form factor and long length. The attributes of Applicant's waveguides provide for an ideal solution for THz communication and could address the drawbacks mentioned above. These attributes include, but are not limited to, an ultrahigh purity alumina that enables great dielectric performance, a fine grain size that provides for excellent flexibility and mechanical strength, a thin form factor, and a long length. Applicants have developed a new way to cost effectively fabricate an attractive material into a form factor that is beneficial for the microwave/mmWave applications and configurations to make use of such a material.

SUMMARY

The present disclosure relates to the use of ceramic dielectric waveguides resulting in the low loss propagation of high-frequency signals in or on printed circuit boards. One aspect of the present disclosure is an assembly, comprising: a printed circuit board (PCB) assembly comprising opposite first and second ends and at least one PCB layer wherein the at least one PCB layer comprises at least one conductive element, an integrated circuit (IC) operably disposed on the top surface of the PCB assembly by I/O pads, the IC having at least one IC device, a at least one coupling element, a ceramic dielectric terahertz (THz) waveguide for guiding signals having a THz frequency in the range from about 0.1 THz to about 10 THz comprising a ceramic core comprising an alumina ribbon wherein the alumina ribbon has a dielectric constant (Dk1) and a cladding surrounding the ceramic core, wherein the cladding has a dielectric constant (Dk2) such that Dk2<Dk1, and a major surface and an access aperture wherein the major surface is disposed between the first end and second end, and the ceramic dielectric waveguide is mounted to the top surface of at least one PCB layer, the ceramic dielectric terahertz (THz) waveguide comprising a first-end section with an end face accessible through the access aperture. In another aspect, the printed circuit board is an optical-electrical printed circuit board (OE-PCB).

In another aspect, the ceramic core is surrounded on two parallel sides by at least one cutout. In a further aspect, the at least one cutout is empty. In an alternative aspect, the at least one cutout is filled with a dielectric material having a dielectric constant lower than the dielectric constant that of the ceramic core. In a further aspect, the dielectric material is polymer, glass, or silicon dioxide. In yet a further aspect, the polymer is selected from the group consisting of polytetrafluoroethylene (PTFE), SU-8, fluoropolymers, and polystyrene, polyimide (Kapton or Cirlex), parylene-N, high-density polyethylene (HDPE), polypropylene (PP) and polyethylene cyclic olefin copolymer (Topas), polybenzoxazole (PBO), benzocyclobutene (RCB), and liquid crystal polymers.

In another aspect, the at least one cutout has a bending angle of at least 10 degrees, alternatively at least 20 degrees, alternatively at least 30 degrees, alternatively at least 40 degrees, alternatively at least 45 degrees, alternatively at least 50 degrees, alternatively at least 60 degrees, alternatively at least 70 degrees, alternatively at least 80 degrees, or alternatively at least 90 degrees. In another aspect, the at least one cutout progressively tapers along the propagation direction. In yet another aspect, the cutout comprises an array of holes. In a further aspect, the array of holes creates an electronic bandgap cladding layer. In a further aspect, the holes are uniform in shape, size, and/or linear placement. In yet a further aspect, the holes vary in size along the propagation direction.

In another aspect, the electronic assembly further comprises a cavity for a source component and a cavity for a detector component on opposite terminal ends of the ceramic dielectric terahertz (THz) waveguide. In another aspect, the source component is a transmitter or transceiver. In yet another aspect, the detector component is a receiver or receive side of a transceiver. Transceiver it is device with a transmitter and receiver and is used in most bidirectional communication applications.

In another aspect, the electronic assembly further comprises a strut, wherein the strut consists of an alumina ribbon, and wherein the strut is at the terminal ends of the ceramic dielectric terahertz (THz) waveguide. In another aspect, the electronic assembly further comprises a least one strut, wherein the strut is transverse to the ceramic dielectric terahertz (THz) waveguide.

In another aspect, the ceramic dielectric terahertz (THz) waveguide is fully or partially embedded within the printed circuit board (PCB) assembly. In yet another aspect, the ceramic dielectric terahertz (THz) waveguide is disposed between at least two PCB layers. In yet another aspect, the ceramic dielectric terahertz (THz) waveguide is mounted directly on the top surface of the printed circuit board (PCB) assembly.

In another aspect, the coupling element is located on the top, the bottom, or the first or the second end of the printed circuit board (PCB) assembly. In yet another aspect, the coupling element acts as an antenna. A coupling element can be used to launch the signal from a conducting/metallic waveguide into the dielectric waveguide. Such a coupling element may be referred to as an 'antenna', but a human or computer designed/optimized coupling element does not need to look like a conventional antenna.

In another aspect, at least one end of the ceramic dielectric terahertz (THz) waveguide is tapered. In a further aspect, the coupling element runs along the tapered edge to the top surface of the printed circuit board (PCB) assembly. In another aspect, the coupling element is connected directly to at least one PCB layer. In another aspect, the coupling element is connected to at least one PCB layer through at least one conductive via. In yet another aspect, the coupling element couples a conductive transmission waveguide to a dielectric waveguide.

In another aspect, the electronic assembly further comprises a glass substrate mounted on the top surface of the printed circuit board (PCB) assembly. In yet another aspect, the ceramic dielectric terahertz (THz) waveguide is mounted on the top surface of the glass substrate.

In another aspect, the electronic assembly further comprises a port/interface component. In a further aspect, the port/interface component is mounted on each source and detector component.

In another aspect, the ceramic core has a circular, elliptical or rectangular cross-sectional shape. In another aspect, the ceramic dielectric terahertz (THz) waveguide is non-planar. In yet another aspect, the ceramic dielectric terahertz (THz) waveguide is planar and the ceramic core has opposite first and second planar surfaces and a thickness in the range from 10 μm to 500 μm; and the cladding is defined by first and second planar layers respectively disposed immediately adjacent the first and second planar surfaces of the ceramic core, the first and second layers having dielectric constants (Dk2 and Dk3) such that Dk2<Dk1 and Dk3<Dk1.

One aspect of the present disclosure is a ceramic dielectric terahertz (THz) waveguide for guiding signals having a THz frequency in the range from about 0.1 THz to about 10 THz comprising a ceramic core comprising an alumina ribbon wherein the alumina ribbon has a dielectric constant (Dk1), wherein the ceramic core is surrounded on at least two parallel sides by at least one cutout, wherein the at least one cutout create an electronic bandgap cladding layer, and wherein the electronic bandgap cladding layer has a dielectric constant (Dk2) such that Dk2<Dk1.

In another aspect, the at least one cutout is empty. In an alternative aspect, the at least one cutout is filled with a dielectric material having a dielectric constant lower than the dielectric constant that of the ceramic core. In a further aspect, the dielectric material is polymer, glass, or silicon dioxide. In yet a further aspect, the polymer is selected from the group consisting of polytetrafluoroethylene (PTFE), SU-8, fluoropolymers, and polystyrene, polyimide (Kapton or Cirlex), parylene-N, high-density polyethylene (HDPE), polypropylene (PP) and polyethylene cyclic olefin copolymer (Topas), polybenzoxazole (PBO), benzocyclobutene (BCB), and liquid crystal polymers.

In another aspect, the at least one cutout has a bending angle of at least 10 degrees, alternatively at least 20 degrees, alternatively at least 30 degrees, alternatively at least 40 degrees, alternatively at least 45 degrees, alternatively at least 50 degrees, alternatively at least 60 degrees, alternatively at least 70 degrees, alternatively at least 80 degrees, or alternatively at least 90 degrees. In another aspect, the at least one cutout progressively tapers along the propagation direction. In an alternative aspect, the at least one cutout comprises an array of holes. In a further aspect, the holes are uniform in shape, size, and/or linear placement. In a further alternative aspect, the holes vary in size along the propagation direction.

The presently described and claimed technology has numerous advantages, including, but not limited to, (1) reducing manufacturing costs for parallel links in a circuit; (2) simplifying alignment of a transmitter or receiver by precisely creating patterns in a sheet of ceramic material due to its rigid structure; (3) saving power within the circuit due to no longer needing to convert from electrical to optical signals or optical to electrical signals; (4) simplifying transmitter and/or receiver assembly; (5) having lower loss than conventional conductive waveguides at mm wave frequencies because mm waves can be excited directly in dielectric THz waveguides without costly and high-loss lasers and photodetectors; (6) industrializing known waveguide fabrication techniques that provide high quality waveguides, e.g., laser hole formation or singulation, dielectric dip-coating or coating die; (7) more easily creating interconnects through the use of waveguides embedded as a sheet of ceramic material; (8) using effective index cladding material allowing for fine tuning of the confinement of the guided electromagnetic radiation and the number of propagating modes; (9) creating transitions in that confinement that can more easily be made in effective index material, such as soot by localized heating and sintering of the silica particles along the propagation direction; and (10) creating THz waveguides with different rigid geometries making coupling more efficient. providing a millimeter wave waveguiding technology that can be readily incorporated into established electronic circuit board fabrication and assembly techniques These and other advantages and novel features of the present invention, as well as details of illustrated aspects thereof will be more fully understood from the following description and from the figures.

BRIEF DESCRIPTION OF SEVERAL VIEWS OF THE DRAWINGS

These as well as other features of the present invention will become more apparent upon reference to the drawings wherein:

FIG. 8 illustrates a cross-section view of a sample configuration of an assembly with a mounted dielectric material encompassing a glass substrate used to support a ceramic dielectric terahertz (THz) waveguide and a coupling element which connects to a via where the via intersects with a PCB layer embedded within the printed circuit board (PCB) assembly FIG. 9A illustrates a top view of alumina ribbon cut out in regions to create straight pathways that run along the x-axis. FIG. 9B illustrates a top view of alumina ribbon cut out in regions to create a 90 degree waveguide bend.

FIG. 10A illustrates a top view of alumina ribbon cut out in regions to create an adiabatic taper for mode conversion. FIG. 10B illustrates a top view of alumina ribbon cut out in regions to create a splitter/combiner.

FIG. 11A illustrates a top view of alumina ribbon wherein a ceramic dielectric terahertz (THz) waveguide is terminated by cutouts. FIG. 11B illustrates a top view of alumina ribbon with periodic cross braces wherein a waveguide is terminated.

Figure 1:
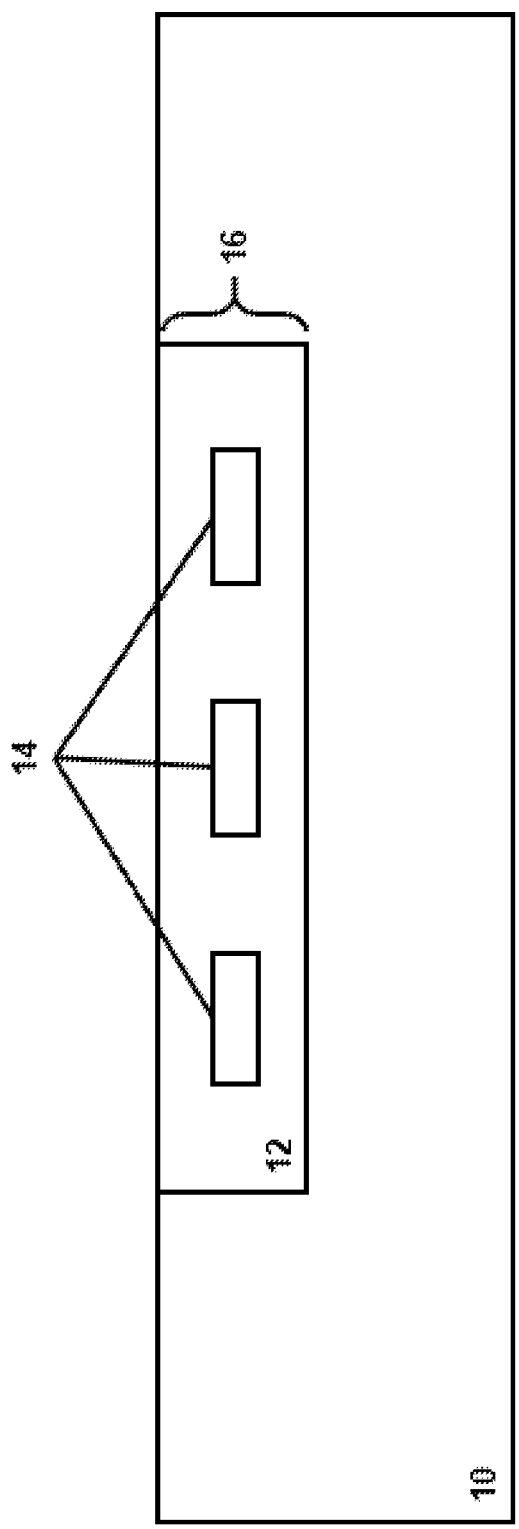
FIG. 1 illustrates a cross-section view of multiple alumina waveguides surrounded by a dielectric material embedded within a printed circuit board.

The foregoing summary, as well as the following detailed description of certain features of the present application, will be better understood when read in conjunction with the appended drawings. For the purposes of illustration, certain features are shown in the drawings. It should be understood, however, that the claims are not limited to the arrangements shown in the attached drawings.

DETAILED DESCRIPTION

Referring generally to the figures, aspects of the present disclosure relate to the use of a ceramic dielectric waveguide to couple an electrical transmission line signal with that of a printed circuit board. Advantageously, the shape and position of the ceramic dielectric waveguide with respect to the printed circuit board adjusts how the electromagnetic field of the waveguide couples with that of the conductive structures within the printed circuit board, creating opportunities to make propagation of THz waves more efficient and less lossy. Also advantageously, the potential addition coupling elements such as antenna elements creates more opportunities for the same. Some potential shapes and positions of the ceramic dielectric waveguide, along with the potential addition of antenna or coupling elements, will be discussed in the following sections. The aspects described herein are for the purposes of illustration and should not be considered limiting.

Waveguide Creation

The present disclosure relates to waveguides configured to transmit electromagnetic waves within the THz range that include a ceramic core and an optional dielectric material cladding. Amongst other factors, propagation of an electromagnetic wave is influenced by the size and shape of the waveguide. In some aspects, a ceramic core with smaller cross-sectional dimensions may be more suitable for transmitting waves in the THz range than a core with larger cross-sectional dimensions. The ceramic core may have a cross-sectional dimension in the range of about 10 microns to about 500 microns (μm), preferably about 20 μm. The cross sectional dimension is not limited to rectangular cross-sectional shapes but may be applied interchangeably to circular, elliptical, or other cross-sectional shapes.

The ceramic core may be comprised of any suitable ceramic material and may be rectangular or ribbon-shaped. Electromagnetic waves propagate within the confines of the walls of a waveguide, with the walls acting as boundaries. Therefore, some cross-sectional shapes may be more suitable for transmitting waves in the THz range than other cross-sectional shapes.

In some aspects, the THz waveguide may have a long form factor. In these aspect, the THz waveguide 10 may have a length 12 of about 3 centimeters (cm) or greater. A longer form factor may be more suitable for transmitting waves in the THz range than a shorter form factor. Similarly, a longer form factor may be more suitable for transmitting waves over a longer distance than a shorter form factor that transmits waves over a shorter distance.

In other aspects, the THz waveguide may also be thin. For example, it may have a rectangular cross-section of a THz waveguide having a width and a height. In this aspect, the ceramic core may have a width or height in the range of about 20 μm to about 500 μm, preferably about 20 μm. A ceramic core with a smaller width and/or height may be more suitable for transmitting waves in the THz range than a ceramic core with a larger width and/or height. Similarly, a ceramic core with a smaller width and/or height may be more suitable for THz applications requiring smaller waveguides, e.g. inter-chip interconnects or chip-to-chip communication.

In some aspects, the THz waveguides may transmit signals in the frequency range of about 0.1 THz to about 10 THz with a ceramic core comprised of alumina. In other aspects, an alumina core may be comprised of ultra-high purity alumina with a purity level of about 99% or higher, about 99.5% or higher, about 99.75% or higher, about 99.9%, about 99.95% or higher, about 99.96% or higher, or about 99.99% or higher. In yet a further aspect, the alumina has a purity of about 99.96% or higher. In these aspects, an alumina core with a high purity level enables greater dielectric performance than an alumina core with lower purity level. In one aspect, the core may have a Dk in the range of 10-1000 and a dissipation factor ("Df") in the range of less than $1\times10^{-3}$, preferably a Dk=10 and a Df<=$1\times10^{-4}$, respectively. In view of the present aspects, a waveguide comprised of a high purity alumina core can effectively transmit signals within the THz range while still having low transmission loss.

In other aspects, the alumina ceramic core may have a Dk of $\varepsilon_r$, surrounded by air. A high dielectric constant can enable single mode operation in a wide frequency window. Waveguide propagation modes depend on the operating wavelength and polarization, along with the shape and size of the waveguide. For the rectangular waveguide shown in FIG. 1A, normalized frequency parameters are provided below:

$$V_x = \frac{2\pi f}{c} w \sqrt{\varepsilon_r - 1}$$

$$V_y = \frac{2\pi f}{c} h \sqrt{\varepsilon_r - 1}$$

For single mode operation in both the x and y directions, $V_x=\pi$, and $V_y=\pi$. The cutoff frequency for single mode operation can be determined by the following equations:

$$f_c = \frac{C}{2w\sqrt{\varepsilon_r - 1}} \text{ for single mode in the x-direction}$$

$$f_c = \frac{C}{2h\sqrt{\varepsilon_r - 1}} \text{ for single mode in the y-direction}$$

Depending on the form factor of the waveguide and its dielectric properties, a waveguide can permit single mode operation at a high cut-off frequency. Single mode operation can be achieved if the waveguide dimensions width (w) and height (h) satisfy the above equations. For material with a high dielectric constant, the waveguide dimensions can be reduced for single mode operation. Small waveguide dimensions increase the waveguide density for waveguide arrays used in interconnects and improve the mechanical flexibility. For a suitably dimensioned alumina ceramic ribbon waveguide having low-loss and a high dielectric constant, the waveguide can exhibit an attenuation coefficient of less than 10 dB/cm.

A THz waveguide needs to have both low transmission loss in the THz frequency and a wide range of mechanical properties that allow for operation in a variety of environmental conditions. In one aspect, the ceramic core comprises alumina and may have a grain size of at least about 0.5 μm. A ceramic core that comprises alumina with a smaller grain size can be denser and may exhibit more flexibility than a ceramic core with a larger grain size. In some aspects, ceramic core that comprises alumina with a grain size of at least about 0.5 μm may have variable flexibility, e.g. a bending radius of about 17 mm for a form factor with a thickness in the range from about 10 μm to about 200 μm. In view of the present aspects, a waveguide comprised of a ceramic core that comprises alumina can effectively transmit signals within the THz range while still having low transmission loss and improved flexibility.

Conventional waveguides that exhibit flexibility may still fracture or shatter when exposed to a variety environmental conditions. Therefore, a THz waveguide that has greater mechanical strength but remains flexible, pliable, or supple, may be more suitable for terahertz applications. As discussed above, a ceramic core that comprises alumina with a smaller grain size can be denser and may exhibit more flexibility, and mechanical strength, than a ceramic core that comprises alumina with a larger grain size. In some aspects, a ceramic core that comprises alumina with a grain size of at least about 0.5 μm may have a mechanical strength of at least 700 MPa when undergoing a 2 pt flexural bending strength test. In view of the present aspects, a waveguide comprised of a ceramic core that comprises alumina can effectively transmit signals within the THz range while still having low transmission loss and improved strength.

In other aspects, the ceramic core material is not limited to alumina; core material may also include, for example, silica (Dk~4), mullite (Dk~6), magnesium titinate (Dk~15-20), zirconium tin titinate (Dk~37), titania (Dk~100), or barium titinate (Dk>1000). Other core materials are contemplated that similarly transmit signals in the frequency range of 0.1 THz to 10 THz but provide for a high Dk.

In some aspects, a THz waveguide may have a cladding disposed around a ceramic core that comprises alumina. A cladding serves as a protective gliding material for a ceramic core thereby enabling propagation in the THz range with low transmission loss. In addition, a cladding may inhibit any potential interactions between a propagating wave and the surrounding environment.

A cladding can be disposed around a ceramic. In some aspects, it may be preferable for cladding to have a lower dielectric constant than the dielectric constant of core. In other aspects, it may be preferable for cladding to have a Df less than $1 \times 10^{-3}$. As a result, cladding may assist in confining an electromagnetic wave inside the ceramic core structure so that it limits how much the fields spread out, and losses resulting from this effect are eliminated. It is advantageous for cladding to have a similar loss tangent in the THz range as the ceramic core (though it can be somewhat higher because the total loss is less sensitive to the cladding), as well as a low dielectric constant so to minimize transmission loss and the size of the structure formed as part of the waveguide. In some aspects, cladding may have a dielectric constant within the range of 10-1000.

Cladding 25 can be made of air, glass, silicon dioxide (silica glass), or polymers. In aspects where cladding 25 is made of a polymer, polymers may include, for example, SU-8, polytetrafluoroethylene (Teflon), or other fluoropolymers that have low loss properties in the frequency range of 100 GHz-1000 GHz. Other suitable materials for the cladding 18 may be any combination thereof.

Figure 5:
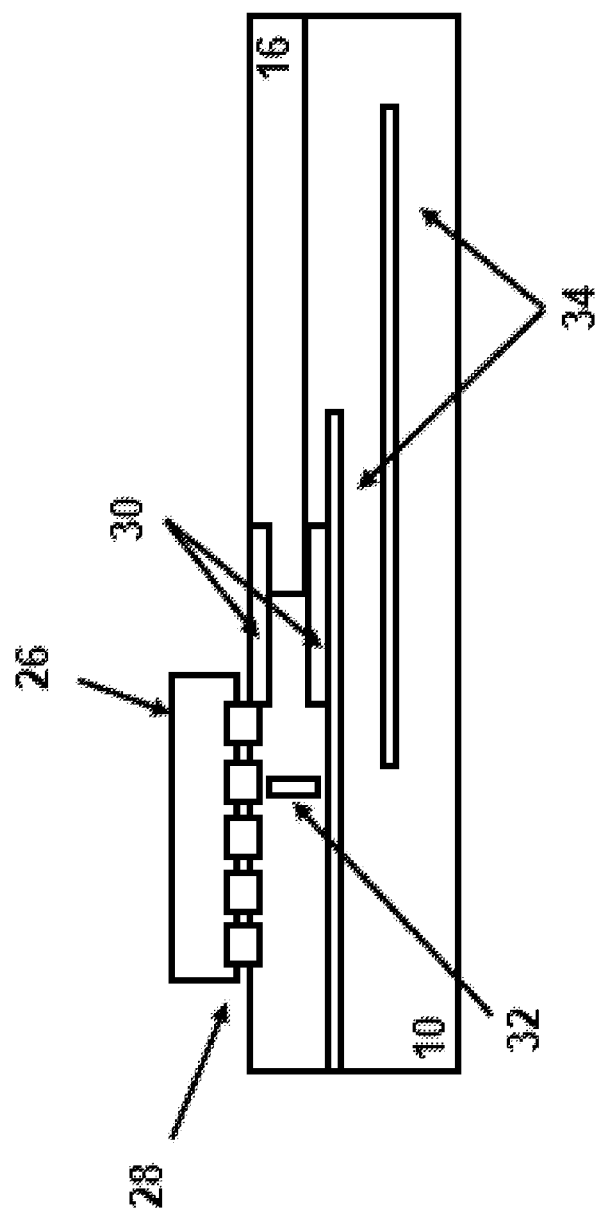
FIG. 5 illustrates a cross-section view of a sample configuration of assembly and multiple coupling elements embedded within the printed circuit board (PCB) assembly to couple the electrical transmission signal to the embedded ceramic dielectric terahertz (THz) waveguide.

As discussed above, FIG. 1D shows an aspect where a THz waveguide may have a planar configuration. In this aspect, the ceramic core 21 may be comprised of opposite first 22 and second 23 planar surfaces. FIG. 5 shows one aspect where a cladding is defined by a first 27 and second 28 planar layer that may be respectively disposed immediately adjacent to the first 29 and second 30 planar surfaces of the ceramic core.

In some aspects, it may be preferable for the first planar 27 layer of the cladding to have a lower dielectric constant than the dielectric constant of ceramic core. In other aspects, it may be preferable for the second 28 planar layer of the cladding to have a lower dielectric constant than the dielectric constant of the ceramic core. In other aspects, it may be preferable for both the first 27 and second 28 planar layers of the cladding to have lower dielectric constants than the dielectric constant of the ceramic core. As a result, the first 27 and second 28 planar layers of the cladding may assist in confining an electromagnetic wave inside the ceramic core structure so that it does not spread out, and losses resulting from this effect are eliminated. It is advantageous for the first and second planar layers of the cladding to have a similar loss tangent in the THz range as the ceramic core, as well as a low Dk so to minimize transmission loss and the size of the structure formed as part of the waveguide.

In yet another aspect, it may be preferable for the first planar 27 layer of the cladding to have a Df less than $1 \times 10^{-3}$. In other aspects, it may be preferable for the second 28 planar layer of the cladding to have a Df less than $1 \times 10^{-3}$. In other aspects, it may be preferable for both the first 27 and second 28 planar layers of the cladding to have a Df less than $1 \times 10^{-3}$. As a result, the first 27 and second 28 planar layers of the cladding may assist in confining an electromagnetic wave inside the ceramic core structure so that it does not spread out, and losses resulting from this effect are eliminated. It is advantageous for the first and second planar layers of the cladding to have a similar loss tangent in the THz range as the core, as well as a low DF so to minimize transmission loss and the size of the structure formed as part of the waveguide.

The first and second planar layers of the cladding can be made of air, glass, silicon dioxide (silica glass), or polymers. In aspects where the first and second planar layers of the cladding are made of a polymer, polymers may include, for example, SU-8, polytetrafluoroethylene (Teflon), or other fluoropolymers that have low loss properties in the frequency range of 100 GHz-1000 GHz. Other suitable materials for the cladding 18 may be glass, air, polymer and any combination thereof.

In aspects where a cladding is disposed around a ceramic core, the waveguide may become stiff, inflexible, or fragile. In addition, disposing a cladding around a ceramic core may increase the overall size of the waveguide. Therefore, the thickness of a cladding may influence the flexibility, durability, and size of a waveguide. In one aspect, the cladding comprises a thickness 31 in the range from 0.1 mm to 10 mm. In another aspect, the first and second planar layers of a cladding comprises a thickness in the range of 0.1 mm to 10 mm. Because of the thickness of a cladding, a THz waveguide may remain flexible with the added benefit of reducing the overall size of the waveguide structure.

FIG. 9A illustrates a top view of a ceramic ribbon 40 cut out in regions 42 to create an array of THz waveguides 14. Each ceramic ribbon 40 may range from 1 mm to 100 mm in width. Each cutout 42 may range from 10 um to 5 mm in width. Each waveguide 14 may range from 100 nm to 1 mm in width. Each cutout 42 may be created by laser cutting, ablation, perforation and separation process, or any similar process.

A cutout 42 may be filled with air, forming a cladding layer between each waveguide 14. Cladding material can be composed of two materials of differing dielectric constants acting as an effective index material such that they retain their distinct composition in local regions upon combination, the size of these distinct regions being much less than the THz operating wavelength, and on average the dielectric constant of the cladding material is lower than the dielectric constant of the THz waveguide 14. An example of cladding material could be a fluoropolymer where it is made porous with air bubbles to lower the dielectric constant and the pore size is much less than the THz operating wavelength. Another example of cladding material could be silica soot deposited as a cladding. Pore size as deposited is small enough that silica soot need not be consolidated. Localized heating and consolidation can be done to create transitions in the THz waveguide effective index that can be useful for mode field conversion. Alternatively, any or all cutouts 42 may also be filled with a dielectric material, for example a polymer, having a lower dielectric constant than a THz waveguide 14. Each cutout 42 shown runs in a straight line, but it is also contemplated within the scope of the present invention that it may contain a bend, for example a cutout curved by somewhere between 0-90 degrees (see FIG. 9B).

FIG. 10A illustrates a top view of a ceramic ribbon 40 cut out in regions 42 to create an adiabatic taper for THz waveguide mode conversion along the propagation direction. This allows for coupling between a THz waveguide with a relatively wide width to a THz waveguide with a relatively narrow width, or vice versa depending on the direction of propagation. Each ceramic ribbon 40 may range from 1 to 100 mm in width. Each cutout 42 may range from 10 um to 5 mm in width. Each waveguide 14 may range from 100 nm to 1 mm in width before the taper and from 1 um to 1 mm in width after the taper. Each cutout 42 may be created by laser cutting, ablation, perforation and separation process, or any similar process. A cutout 42 may be filled with air, forming a cladding layer between waveguides 14. Alternatively, any or all cutouts 42 may also be filled with a dielectric material, for example a polymer, having a lower dielectric constant than a THz waveguide 14. Rather than an adiabatic taper, a ceramic ribbon 40 may be cut out in regions 42 to create a splitter or combiner, depending on the propagation direction (see FIG. 10B). The splitter shown has a waveguide 14 splitting in to two separate waveguides 14, but it is also contemplated within the scope of the present invention that a waveguide 14 may split in to two or more parts. Likewise, the combiner shown has two separate waveguides 14 combining into one waveguide 14, but it is within the scope of the present invention that a combiner may combine two or more separate waveguides 14.

FIG. 11A illustrates a top view of a ceramic ribbon 40 cut out in regions 42 to create a THz waveguide 14. A cutout 42 exists near each end of the waveguide 14 allowing space for a transmitter 44 and receiver 46. Each cutout 42 may be created by laser cutting, ablation, perforation and separation process, or any similar process. Between the THz waveguide 14 and the space for a transmitter 44 or receiver 46 is at least one strut, which comprises a strip of ceramic ribbon, 48 with a width much less than a single THz frequency wavelength. The narrow width of the strut 48 between the THz waveguide 14 creates edge coupling of THz electromagnetic radiation into or out of the waveguide 14 from a source 20 or detector 22, respectively. To add more mechanical support to the THz waveguide 14, struts 48 may be added transverse to the ceramic dielectric terahertz waveguide, creating smaller cutout regions 42 (see FIG. 11B).

Figure 12:
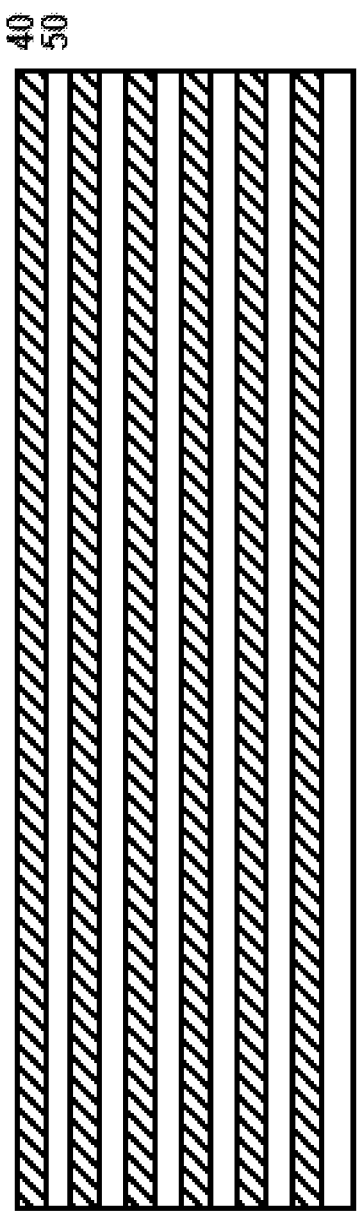
FIG. 12 illustrates a side view of a multi-layer stack of waveguides.

FIG. 12 illustrates a side view of multiple layers of ceramic ribbon 40 separated from each other by layers of dielectric material 50 having a lower dielectric constant than the THz waveguide 14. Each layer of ceramic ribbon 42 may have embedded within it one or more THz waveguides 14, one or more waveguide devices, one or more sources (e.g., transmitters) 20, and/or one or more detectors (e.g. receivers) 22. Each layer of dielectric material 50 acts as a waveguide material and may be a polymer or other suitable material with a dielectric constant lower than that of the THz waveguide 14. The layers shown are singular (i.e., alternating one layer of dielectric material with one layer of ceramic ribbon), but it is within the scope of the present invention that there may be one or more layers of dielectric material 50 between each layer of ceramic ribbon 40. It is also within the scope of the present invention that there may be one or more layers of ceramic ribbon 40 between each layer of dielectric material 50.

Figure 13A:
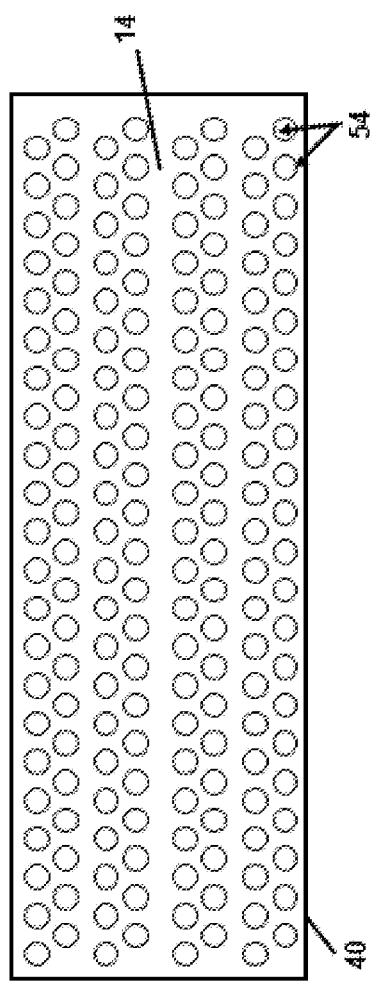
FIG. 13A illustrates a ceramic dielectric terahertz (THz) waveguide with an array of hole creating a uniform electronic bandgap cladding layer.
Figure 13B:
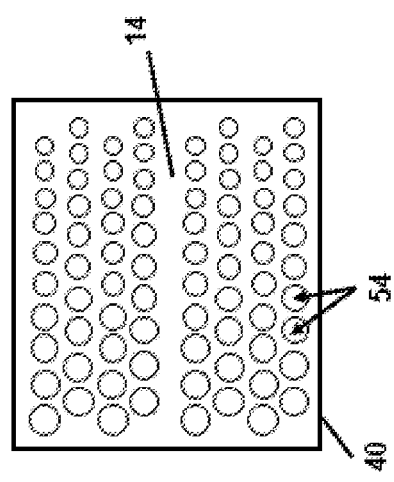
FIG. 13B illustrates a ceramic dielectric terahertz (THz) waveguide with an array of hole creating a tapered electronic bandgap cladding layer.

FIG. 13A illustrates a top view of a ceramic ribbon 40 cut out in an array of circular holes 54 uniform in shape, size, and placement in the region adjacent to the THz waveguide 14 to create a electronic bandgap cladding layer for a THz waveguide 14. Advantageously, light cannot propagate in a electronic bandgap, so light propagation is bound to the core region (i.e., the THz waveguide 14). Each ceramic ribbon 40 may range from 1 to 100 mm in width. Each cutout 54 may range from 10 um to 5 mm in diameter, and are preferably created with a laser. Each waveguide 14 may range from 100 nm to 1 mm in width. A cutout 54 may be filled with air, forming a electronic bandgap cladding layer for a THz waveguide 14. Alternatively, any or all cutouts 54 may be filled with a dielectric material, for example a polymer, having a lower dielectric constant than a THz waveguide 14. The cutouts 54 in the ceramic ribbon 40 provide mechanical support for the THz waveguide 14 without disrupting coupling or propagation or creating excess loss. The cutouts 54 shown are identical, but it is within the scope of the present invention that each cutout 54 may be a shape other than circular, for example, square, rectangular, triangular, or any other polygonal or non-polygonal shape. It is also within the scope of the present invention that the placement of each cutout 54 may be sporadic and not uniform in placement. It is also within the scope of the present invention that the size of each cutout 54 may differ. FIG. 13B, for example, illustrates a top view of a ceramic ribbon 40 cut out in an array of circular holes 54 moving from largest in diameter to smallest in diameter. Variation in the size of the array of holes along the propagation direction creates a taper by varying properties of the THz frequency wave propagating through the THz waveguide 14.

Wire Bonds

Figure 3:
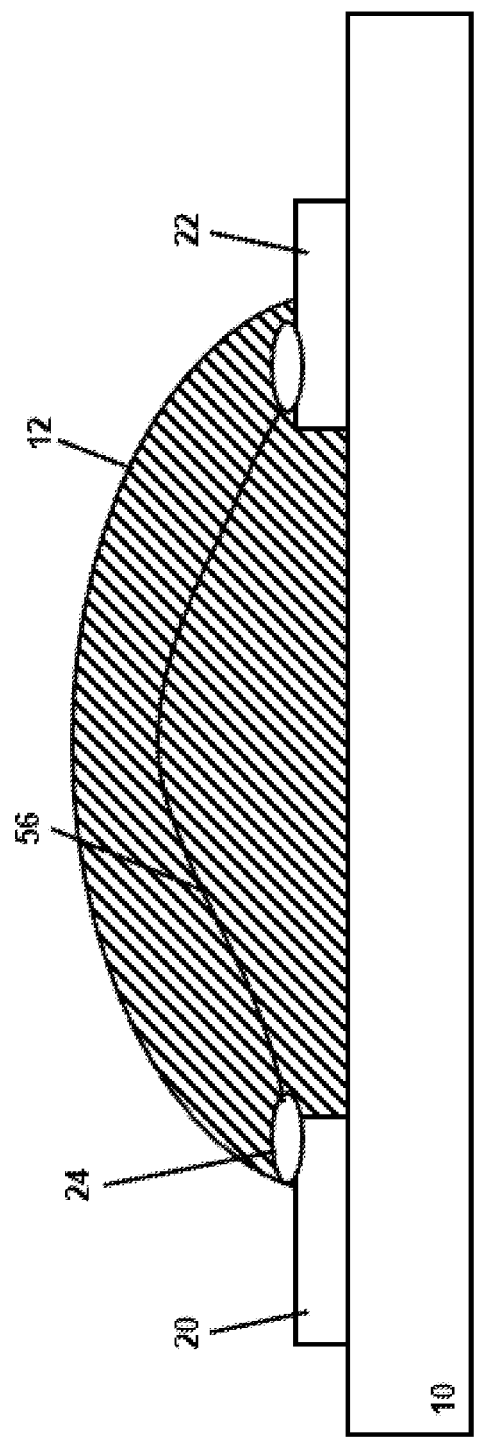
FIG. 3 illustrates a cross-section view of a wire bond link between a transmitter and receiver mounted directly on top of a printed circuit board wherein the ribbon is made of alumina and may be encapsulated by a dielectric material or air.

FIG. 3 illustrates a cross-section of a printed circuit board 10 having assembled on its top surface at least one transmitter component 20 and at least one receiver component 22. Each transmitter component 20 and receiver component 22 includes a connecting port/interface 24 where a ceramic alumina wire 56 may be placed post-assembly thereby connecting the port/interface 24 of the two components 20, 22. Post-assembly placement of the ceramic alumina wire 56 may enable embedded interconnects for surface mount assembly and interconnect of a transmitter 20 or receiver 22 to the THz waveguide 14. Advantageously, this allows flexibility in pick and place assembly of each transmitter 20 and receiver 22, solder reflow, and/or adhesive bonding. The ceramic alumina wire 56 is flexible enough so that it may be coiled. If coiled, the ceramic alumina wire 56 is compact enough that it may be readily unreeled during wire bonding. Advantageously, this allows for each wire bond to be created within seconds. Also advantageously, gold ball wire bonding processes and other state-of-the-art wire bonding tools may be used. Additionally, UV curable adhesives may be used where the ceramic alumina wire 56 is attached to a port/interface 24. UV curable adhesive has the dielectric property of being low loss and may have a dielectric constant lower than that of the ceramic alumina wire 56. The length of the ceramic alumina wire 56 may range from 10 cm to 100 m. Each ceramic alumina wire 56 may have a ceramic alumina core 14 coated in a dielectric material having a dielectric constant lower than that of the ceramic alumina core 14, for example a polymer or any other suitable substance. The dielectric material coating the ceramic alumina core 14 provides a cladding layer for the ceramic alumina core 14. The ceramic alumina wire 56 may have a protective or shielding layer (e.g., a metal). After the ceramic alumina wire 56 is connected to a port/interface 24, it may be embedded in a dielectric material having a lower dielectric constant than that of the ceramic alumina wire 56, for example a polymer, air, or any other suitable material.

Planar Ceramic Dielectric Waveguide

FIG. 1 illustrates a cross-section of a printed circuit board 10 having a ceramic dielectric waveguide 16 embedded within its circuit substrate and extending along the z-axis. The printed circuit board 10 may be comprised of one or more layers of ceramic, glass, or other suitable materials. The ceramic dielectric waveguide 16 may be comprised of at least one ceramic core 14, for example alumina, zirconia, titania, silica, or any other suitable material, embedded within another dielectric 12, for example a polymer, glass, or any other suitable material. The surrounding dielectric 12 becomes a cladding so that the strip(s) of ceramic dielectric become the core for guiding THz frequency waves. The surrounding dielectric 12 has a lower dielectric constant than the ceramic core 14 to ensure the THz wave propagates through the waveguide efficiently. The ceramic dielectric waveguide 16 shown has a rectangular configuration, but it is also contemplated within the scope of the present invention that it may have a configuration other than rectangular, for example circular, elliptical, triangular, or any other polygonal or non-polygonal shape. The ceramic core 14 is likewise shown having a rectangular configuration, but it is also contemplated within the scope of the present invention that it may have a configuration other than rectangular, for example circular, elliptical, triangular, or any other polygonal or non-polygonal shape.

Figure 2:
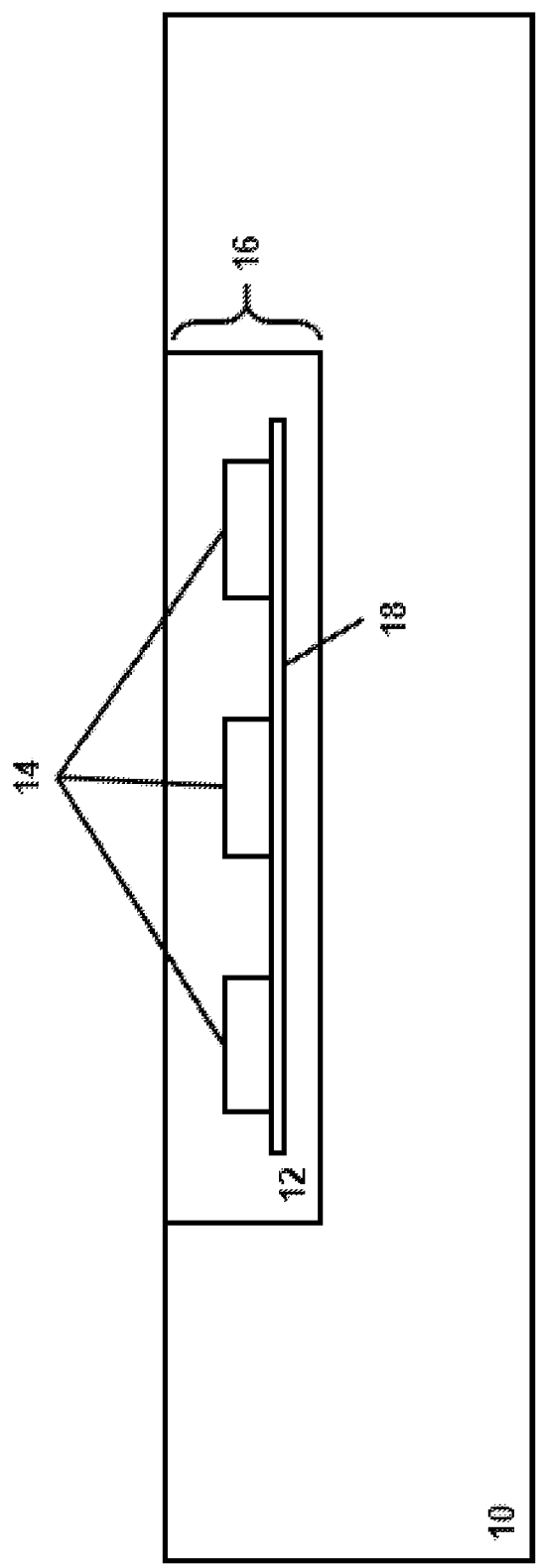
FIG. 2 illustrates a cross-section view of multiple alumina waveguides directly on a common dielectric substrate all surrounded by a different dielectric material embedded within a printed circuit board.

Also embedded within the ceramic dielectric waveguide 16 may be a ceramic support structure 18 (see FIG. 2), where the ceramic support structure 18 is comprised of the same material as the ceramic core and runs perpendicular to the ceramic core 14 along the x-axis. When the ceramic support structure 18 is present at least one ceramic dielectric waveguide 14 can rest directly on top of the ceramic support structure 18.

Figure 4:
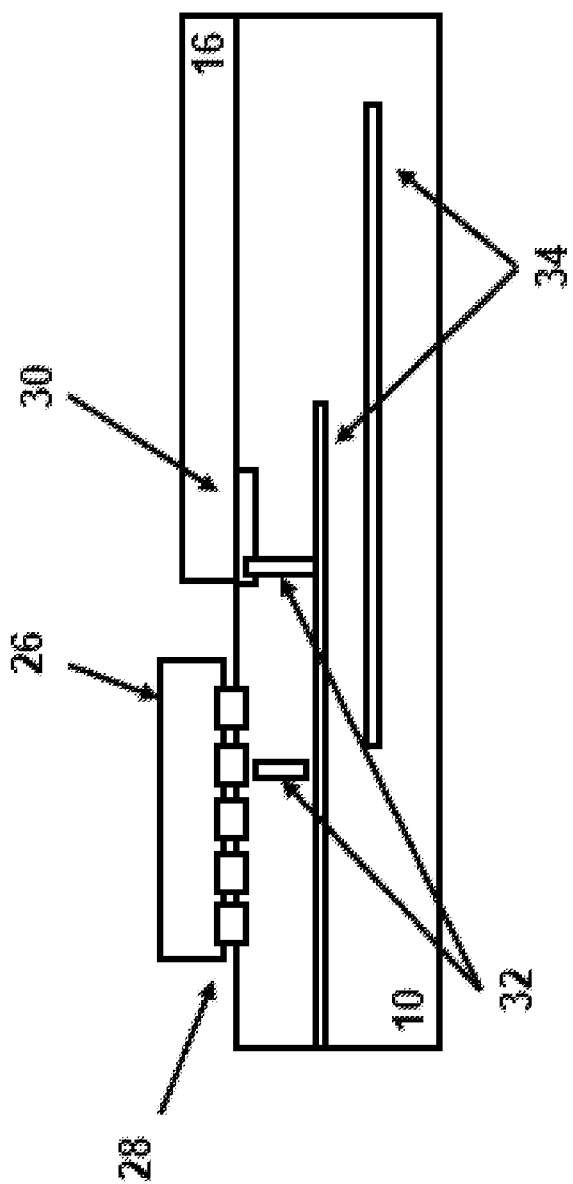
FIG. 4 illustrates a cross-section view of a sample configuration of an electronic circuit board assembly and a waveguide coupling element embedded within the printed circuit board (PCB) assembly to couple the electrical transmission signal to the mounted ceramic dielectric terahertz (THz) waveguide.

FIG. 4 illustrates a cross-section of a printed circuit board 10 having a ceramic dielectric waveguide 16 mounted directly on the top surface of the circuit substrate. Along a portion of the top surface of the circuit substrate, below the ceramic dielectric waveguide 16, may run an antenna or coupling element 30. The antenna or coupling element 30 may couple the electrical transmission line signal from the integrated circuit (IC) 26 to the ceramic dielectric waveguide 16 containing a ceramic core 14. The IC 26 drives the electrical signal through the printed circuit board 10. The IC 26 may be connected to the printed circuit board 10 by metal input/output (I/O) pads 28 that conduct signals in and out of the integrated circuit. The electrical signal generated by the IC 26 may be propagated through vias 32 to PCB conductive layers 34 embedded within the printed circuit board 10. The same electrical signal may further be propagated through PCB conductive layers 34 and/or more vias 32 to the antenna or coupling element 30 which may couple the signal to the ceramic dielectric waveguide 16. The antenna or coupling element 30 shown runs horizontally along the bottom of the ceramic dielectric waveguide 16, but it is also contemplated within the scope of the present invention that it may run vertically along the end surface of the ceramic dielectric waveguide 16. The mixture of vertical and horizontal coupling elements can be used to optimize the coupling to individual modes guided within the dielectric waveguide.

FIG. 5 illustrates a cross-section of a printed circuit board 10 having a ceramic dielectric waveguide 16 embedded within its circuit substrate. Along portions of the top and the bottom surfaces of the ceramic dielectric waveguide 16 may be antennas or coupling elements 30 which may act as a conductive transmission line waveguide to couple the electrical transmission line signal from the IC 26 to the ceramic dielectric waveguide 16. The antenna or coupling elements 30 may connect to embedded conductive layers 34 within the printed circuit board 10 either directly or through one or more vias 32. The antenna or coupling elements may connect to the IC 26 either directly or through embedded conductive layers 34 and vias 32. The antenna or coupling elements 30 shown run horizontally along a portion of the top and the bottom surfaces of the ceramic dielectric waveguide 16, but it is also contemplated within the scope of the present invention that it may run horizontally along a portion of only the top surface of the ceramic dielectric waveguide 16 or along a portion of only the bottom surface of the ceramic dielectric waveguide 16. It is also contemplated within the scope of the present invention that the antenna or coupling element 30 may run vertically along the end surface of the ceramic dielectric waveguide 16. It is also contemplated within the scope of the present invention that the antenna or coupling element 30 may run in a combination of these orientations, including but not limited to, horizontally along the bottom surface and vertically along the end surface of the ceramic dielectric waveguide 16, horizontally along the top surface and vertically along the end surface of the ceramic dielectric waveguide 16, and horizontally along the bottom and top surfaces and vertically along the end surface of the ceramic dielectric waveguide 16.

Figure 6:
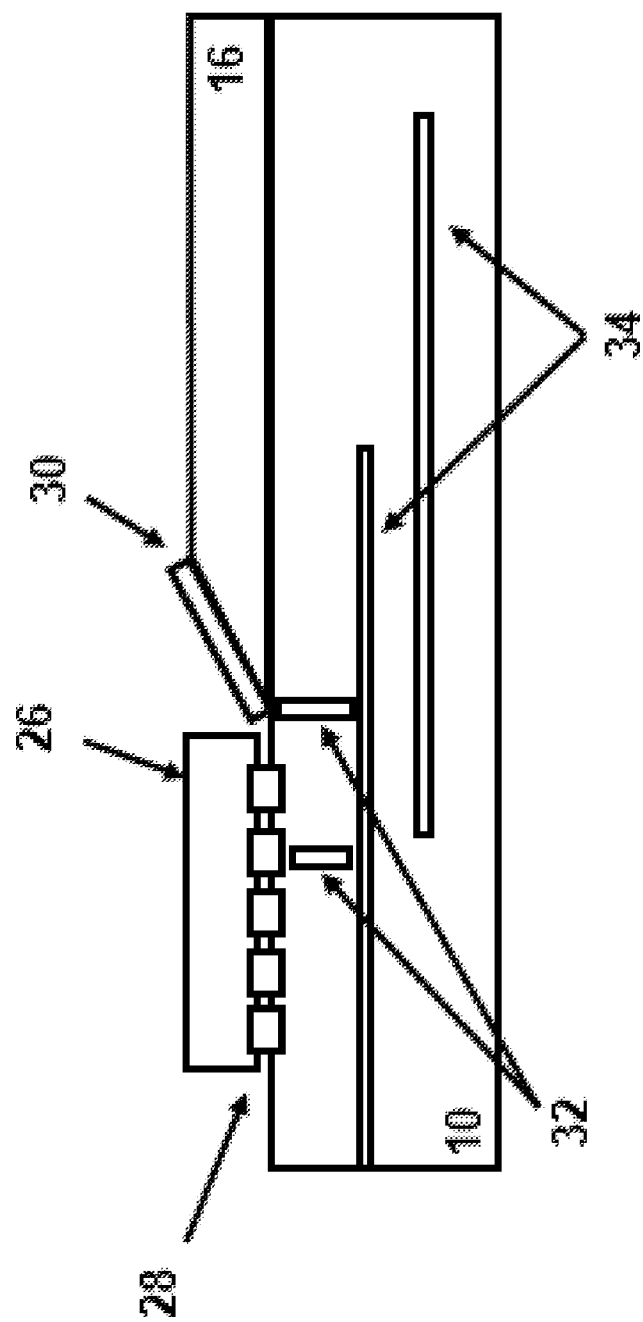
FIG. 6 illustrates a cross-section view of a sample configuration of a assembly with a ceramic dielectric terahertz (THz) waveguide tapered on one end and mounted on the printed circuit board (PCB) assembly and a conductive element running along the tapered end to a conductive pathway ("via") where the via intersects with PCB layers embedded within the printed circuit board (PCB).
Figure 7:
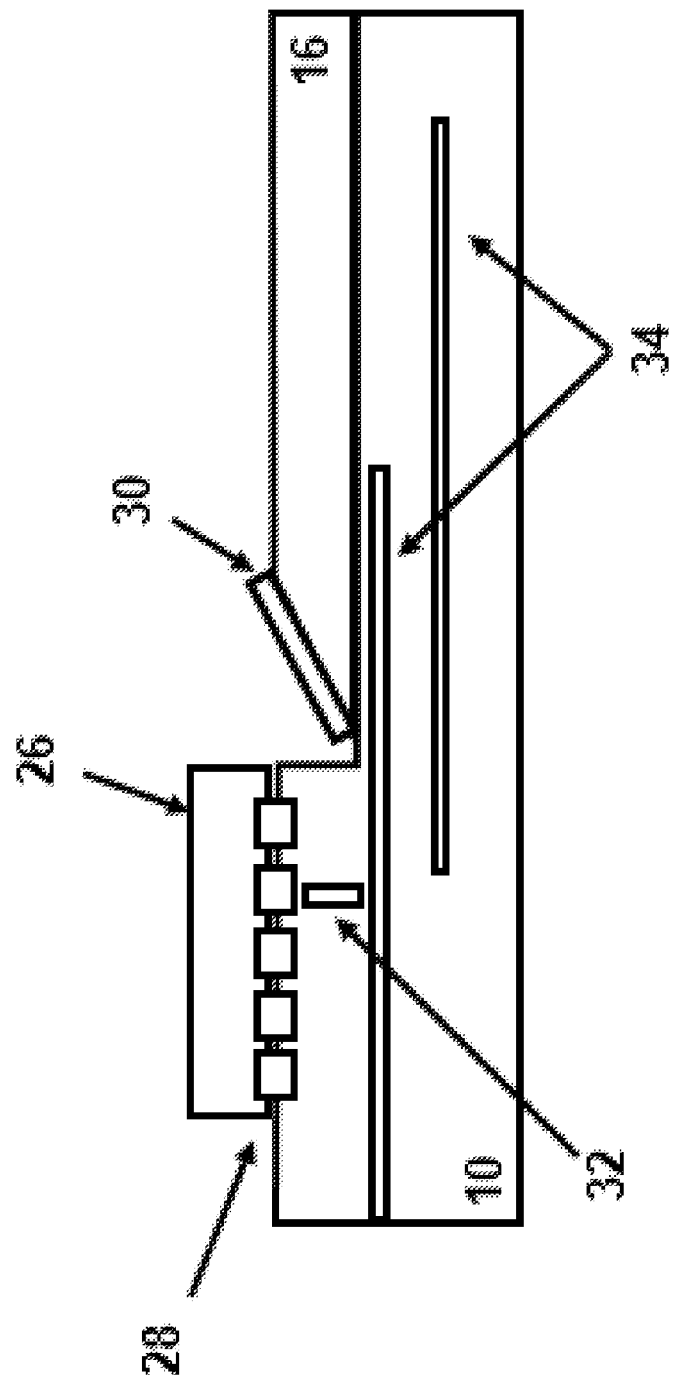
FIG. 7 illustrates a cross-section view of a sample configuration of a assembly with a ceramic dielectric terahertz (THz) waveguide tapered on one end and mounted on a printed circuit board (PCB) assembly and a coupling element running along the tapered end to a PCB layer within the electronic assembly.

FIG. 6 illustrates a cross-section of a printed circuit board 10 having a ceramic dielectric waveguide 16 mounted directly on the top surface of the circuit substrate. The ceramic dielectric waveguide 16 may have a linearly tapered left edge, along which may run an antenna or coupling element 30. The taper or other transition regions increase coupling from the antenna or coupling element 30 which launches the signal into the ceramic dielectric waveguide 16. When the ceramic dielectric waveguide 16 is on the same plane as the IC 26, the antenna or coupling element 30 running along the tapered edge of the ceramic dielectric waveguide 16 may connect to embedded conductive layers 34 within the printed circuit board 10 through a via 32. When the ceramic dielectric waveguide 16 is on a lower plane than the IC 26 (see FIG. 7), the antenna or coupling element 30 running along the tapered edge of the ceramic dielectric waveguide 16 may directly connect to embedded conductive layers 34 within the printed circuit board 10. If the IC 26 is on a higher plane than the ceramic dielectric waveguide 16, the IC may still connect to the embedded conductive layers 34 through a via 32. The ceramic dielectric waveguide 16 is shown having a linearly tapered left edge surface, but it is also contemplated within the scope of the present invention that any edge may be linearly tapered. It is also contemplated within the scope of the present invention that the ceramic dielectric waveguide 16 may have an exponential taper, logarithmic taper, or any other curved taper creating a non-vertical edge. The ceramic dielectric waveguide 16 is shown on the same plane (see FIG. 6) or lower plane (see FIG. 7) compared to the IC 26, but it is contemplated within the scope of the present invention that the ceramic dielectric waveguide 16 may be on a higher plane compared to the IC 26.

FIG. 8 illustrates a cross-section of a printed circuit board 10 having a glass substrate 36 mounted directly on the top surface of the circuit substrate. The glass substrate 36 may support the ceramic dielectric waveguide 16 which rests directly on top of the glass substrate 36. Encompassing the glass substrate 36 and the ceramic dielectric waveguide 16 may be a dielectric material 12, for example a polymer or any other suitable substance with a dielectric constant lower than that of the ceramic dielectric waveguide 16. The dielectric material 12 encompassing the glass substrate 36 and ceramic dielectric waveguide 16 is shown, but it is also contemplated within the scope of the present invention that the dielectric material 12 is an optional element. Encompassed by the glass substrate 36 and connected to the ceramic dielectric waveguide 16 may be an antenna or coupling element 30. The glass substrate 36 supporting the ceramic dielectric waveguide 16 provides a low loss substrate for the antenna or coupling element 30 to launch an electric signal into the ceramic dielectric waveguide 16. The antenna or coupling element 30 may be connected to a via 32 which may intersect between the glass substrate 36 and the circuit substrate of the printed circuit board 10. The via 32 may further intersect with one or more embedded conductive layers 34 within the printed circuit board 10.

In the present disclosure, use of the singular includes the plural except where specifically indicated.

The present described technology is now described in such full, clear, concise, and exact terms as to enable any person skilled in the art to which it pertains to practice the same. It is to be understood that the foregoing described preferred aspects of the technology and that modification may be made therein without departing from the spirit of scope of the invention as set forth in the appended claims. The scope of the following claims is to be accorded the broadest interpretation to encompass all such modifications and equivalent structures and functions. Therefore, it is intended that the application not be limited to the particular aspects disclosed, but that the application will include all aspects falling within the scope of the appended claims.

The invention claimed is:

1. A ceramic dielectric terahertz (THz) waveguide for guiding signals having a THz frequency in the range from about 0.1 THz to about 10 THz, the waveguide comprising:
    a ceramic core comprising an alumina ribbon wherein the alumina ribbon has a dielectric constant ($Dk_1$);
    wherein the ceramic core is surrounded on at least two parallel sides by at least one cutout;
    wherein the at least one cutout creates an electronic bandgap cladding layer;
    wherein the electronic bandgap cladding layer has a dielectric constant ($Dk_2$) such that $Dk_2 < Dk_1$; and
    wherein the at least one cutout has a bending angle of at least 10 degrees.

2. The ceramic dielectric THz waveguide of claim 1, wherein the at least one cutout is empty.

3. The ceramic dielectric THz waveguide of claim 1, wherein the at least one cutout is filled with a dielectric material having a dielectric constant lower than the dielectric constant that of the ceramic core.

4. The ceramic dielectric THz waveguide of claim 3, wherein the dielectric material is polymer, glass, or silicon dioxide.

5. The ceramic dielectric THz waveguide of claim 4, wherein the material is polymer and the polymer is selected from the group consisting of polytetrafluoroethylene (PTFE), SU-8, fluoropolymers, and polystyrene, polyimide (Kapton or Cirlex), parylene-N, high-density polyethylene (HDPE), polypropylene (PP) and polyethylene cyclic olefin copolymer (Topas), polybenzoxazole (PBO), benzocyclobutene (BCB), and liquid crystal polymers.

6. The ceramic dielectric THz waveguide of claim 1, wherein the at least one cutout comprises an array of holes.

7. The ceramic dielectric THz waveguide of claim 6, wherein the holes are uniform in shape, size, and/or linear placement.

8. A ceramic dielectric terahertz (THz) waveguide for guiding signals having a THz frequency in the range from about 0.1 THz to about 10 THz, the waveguide comprising:
    a ceramic core comprising an alumina ribbon wherein the alumina ribbon has a dielectric constant ($Dk_1$);
    wherein the ceramic core is surrounded on at least two parallel sides by at least one cutout;
    wherein the at least one cutout creates an electronic bandgap cladding layer;
    wherein the electronic bandgap cladding layer has a dielectric constant ($Dk_2$) such that $Dk_2 < Dk_1$; and
    wherein the at least one cutout progressively tapers along the propagation direction.

9. The ceramic dielectric THz waveguide of claim 8, wherein the at least one cutout is filled with a dielectric material having a dielectric constant lower than the dielectric constant that of the ceramic core.

10. The ceramic dielectric THz waveguide of claim 9, wherein the dielectric material is polymer, glass, or silicon dioxide.

11. The ceramic dielectric THz waveguide of claim 10, wherein the material is polymer and the polymer is selected from the group consisting of polytetrafluoroethylene (PTFE), SU-8, fluoropolymers, and polystyrene, polyimide (Kapton or Cirlex), parylene-N, high-density polyethylene (HDPE), polypropylene (PP) and polyethylene cyclic olefin copolymer (Topas), polybenzoxazole (PBO), benzocyclobutene (BCB), and liquid crystal polymers.

12. A ceramic dielectric terahertz (THz) waveguide for guiding signals having a THz frequency in the range from about 0.1 THz to about 10 THz, the waveguide comprising:
    a ceramic core comprising an alumina ribbon wherein the alumina ribbon has a dielectric constant ($Dk_1$);
    wherein the ceramic core is surrounded on at least two parallel sides by at least one cutout;
    wherein the at least one cutout creates an electronic bandgap cladding layer;
    wherein the electronic bandgap cladding layer has a dielectric constant ($Dk_2$) such that $Dk_2 < Dk_1$;
    wherein the at least one cutout comprises an array of holes; and
    wherein the holes vary in size along the propagation direction.

13. The ceramic dielectric THz waveguide of claim 12, wherein the at least one cutout is filled with a dielectric material having a dielectric constant lower than the dielectric constant that of the ceramic core.

14. The ceramic dielectric THz waveguide of claim 13, wherein the dielectric material is polymer, glass, or silicon dioxide.

15. The ceramic dielectric THz waveguide of claim 14, wherein the material is polymer and the polymer is selected from the group consisting of polytetrafluoroethylene (PTFE), SU-8, fluoropolymers, and polystyrene, polyimide (Kapton or Cirlex), parylene-N, high-density polyethylene (HDPE), polypropylene (PP) and polyethylene cyclic olefin copolymer (Topas), polybenzoxazole (PBO), benzocyclobutene (BCB), and liquid crystal polymers.

* * * * *

UNITED STATES PATENT AND TRADEMARK OFFICE
CERTIFICATE OF CORRECTION

PATENT NO. : 11,656,407 B2
APPLICATION NO. : 17/391379
DATED : May 23, 2023
INVENTOR(S) : Lars Martin Otfried Brusberg et al.

Page 1 of 1

It is certified that error appears in the above-identified patent and that said Letters Patent is hereby corrected as shown below:

On the Title Page

On page 2, item (56), Column 2, under "Other Publications", Line 1, delete "Transistion" and insert -- Transition --.

In the Claims

In Column 16, Lines 14-15, in Claim 5, delete "benzocylobutene" and insert -- benzocyclobutene --.

In Column 16, Lines 47-48, in Claim 11, delete "benzocylobutene" and insert -- benzocyclobutene --.

In Column 17, Lines 10-11, in Claim 15, delete "benzocylobutene" and insert -- benzocyclobutene --.

Signed and Sealed this
Twenty-fifth Day of June, 2024

Katherine Kelly Vidal
*Director of the United States Patent and Trademark Office*